United States Patent
Masaki et al.

(10) Patent No.: US 6,473,162 B1
(45) Date of Patent: Oct. 29, 2002

(54) METHOD OF COMPUTING DEFOCUS AMOUNT IN LITHOGRAPHY AND LITHOGRAPHIC PROCESS USING THE METHOD

(75) Inventors: Yoshizawa Masaki; Shigeru Moriya, both of Kanagawa (JP)

(73) Assignee: Sony Corporation (JP)

( * ) Notice: Subject to any disclaimer, the term of this patent is extended or adjusted under 35 U.S.C. 154(b) by 71 days.

(21) Appl. No.: 09/664,448

(22) Filed: Sep. 18, 2000

(30) Foreign Application Priority Data

Sep. 20, 1999 (JP) .......................................... 11-265076

(51) Int. Cl.[7] ....................... G03B 27/52; G03B 27/72; G03B 27/54; A61N 5/00; G03L 5/00
(52) U.S. Cl. .............................. 355/55; 355/35; 355/67; 355/77; 250/492.2; 250/492.22; 250/559.4; 430/296; 430/311; 430/312
(58) Field of Search ............................ 355/35, 55, 67, 355/77; 250/492.2, 492.22, 559.4; 430/296, 311, 312

(56) References Cited

U.S. PATENT DOCUMENTS

RE36,964 E * 11/2000 Berger et al.
6,225,639 B1 * 5/2001 Adams et al.
6,258,610 B1 * 7/2001 Blatchford et al.
6,326,618 B1 * 12/2001 Kane et al.

* cited by examiner

Primary Examiner—Russell Adams
Assistant Examiner—Khaled Brown
(74) Attorney, Agent, or Firm—Rader, Fishman & Grauer PLLC; Ronald P. Kananen, Esq.

(57) ABSTRACT

The present invention relates to a method of computing a defocus amount in lithography and lithographic process using the method. A first step executes plural double-exposure operations each including a pattern exposure for forming a pattern of a predetermined line width and a full-area exposure over an area covering the pattern, employing different dosages employed in the full-area exposures for different double-exposure operations. A developing operation is performed. subsequent to the double-exposure, whereby a plurality of resist patterns are obtained. In a second step, the edge roughness and the line width are measured on each resist pattern. In a third step, a Gaussian function is fitted to the edge roughnesses and the line widths. The distribution width of the Gaussian curve is determined as the defocus amount of a pseudo-profile of the beam which indicates a change in lithographic factors that affect the accuracy of lithography.

6 Claims, 5 Drawing Sheets

METHOD OF COMPUTING DEFOCUS AMOUNT IN LITHOGRAPHY AND LITHOGRAPHIC PROCESS USING THE METHOD

BACKGROUND OF THE INVENTION

1. Field of the Invention

The present invention relates to a method of computing an amount of defocus in lithography and also to a lithographic process using the method. More particularly, the present invention pertains to a method of computing a defocus amount that is used as an index for the optimization of lithographic factors that affect lithographic accuracy in a lithographic process which requires formation of fine patterns, as in the case of a semiconductor process. The invention also pertains to a lithographic process which utilizes such a defocus-amount computing method.

2. Description of the Related Art

Lithographic processes which require formation of fine patterns, as in semiconductor processes, employ various devices. Such devices include an exposure device having a projection lens system, e.g., a so-called demagnification projection lens system or a real-size projection lens system, for transferring a reticle pattern onto a wafer, or an exposure device which permits writing of a pattern directly on a wafer by means of an electron beam.

Exposure relying on such an exposure device suffers from a problem in that the lithographic resolution limit is directly affected by a beam defocus that is attributable to aberrations in the lens system. Large aberrations, i.e., a large beam-defocus, a hamper-precise transfer or writing of a pattern onto a wafer, lead to degradation of the characteristics and a malfunction of the product semiconductor devices. In order to obviate this problem, it is essential to adjust the lens system by effecting, for example, optical axis alignment and aberration correction, based on the result of a quantitative detection of the aberrations.

Conventionally, a resist pattern is formed on a wafer at an arbitrary position by a lithographic process, and the line widths of the formed pattern are measured by magnifying the pattern line through an electron microscope. Aberrations and other factors are determined through a computation performed using the measured light widths, and the adjustment of the lens system is effected based on the result of the computation.

In another method, a lens system of an exposure device used in a lithographic process is adjusted in accordance with an amount of defocus calculated based on the waveforms of secondary beams and the reflected beams produced when an edge of a metallic pattern formed in a wafer is scanned with an exposure beam.

The lithographic processes employing these known exposure-device adjusting techniques, however, involve the following problems.

Namely, the first-mentioned adjusting technique relying upon the aberrations determined based on the resist pattern line widths has a drawback in that variations in the lithographic factors, i.e., changes in the characteristics of the lens system of the exposure device, are less likely to appear on the line width of the resist pattern. This leads to a problem in that the values of the aberrations determined based on the line widths tend to involve errors that are not attributable to the lens system but to other factors such as variations in the exposure rate, fluctuation of the developing conditions, temperature distributions in pre-bake and post-bake ovens, and so forth.

It is, therefore, not easy to optimize the lens system of the exposure device through an adjustment using aberrations determined by this technique.

The second-mentioned technique relying upon the scanning of a metallic pattern edge with an exposure beam can accurately determine the amount of the exposure-beam defocus attributable to the lens system. The amount of the defocus of the exposure beam determined by this technique, however, contains error factors such as a defocus caused when the beam is deflected towards the position of the metallic pattern and defocus caused by the scanning oscillation of the exposure beam. Consequently, the defocus amount determined by this technique does not exactly indicate the amount of defocus of the exposure beam alone in the lithography. Optimization of the lens system of the exposure device is therefore difficult to effect, even with the exposure-beam defocus amount determined by the second-mentioned technique.

SUMMARY OF THE INVENTION

Accordingly, it is an object of the present invention to provide a method of computing a defocus amount, as well as a lithographic process, which overcomes the above-described problems of the known arts.

To this end, according to one aspect of the present invention, there is provided a method of computing a defocus amount in lithography comprising the steps of measuring the line width and the edge roughness of a resist pattern formed by lithography and calculating, based on the measured line width and the measured edge roughness, the amount of defocus of a pseudo-profile of the beam used in the lithography.

Figure 9:
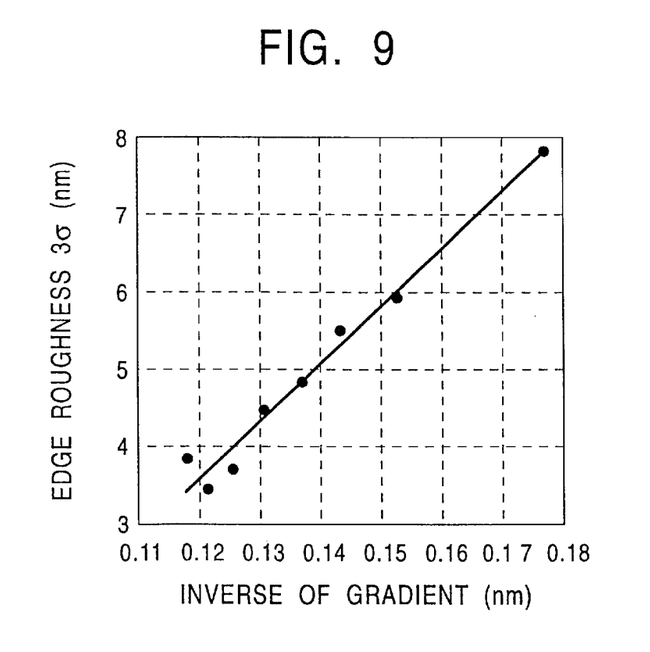
FIG. 9 is a diagram showing the relationship between the inverse of the gradient of a pseudo-profile of the beam and the edge roughness.

In accordance with the invention, the defocus amount of the pseudo-profile of the beam is calculated based on the line width and the edge roughness of the resist pattern. The term "pseudo-profile of the beam" is used here to mean a pseudo-form of the beam profile, i.e., the pseudo-beam intensity distribution, which contains defocus components of all the lithographic factors that affect the accuracy of the lithography. As will be fully described later, FIG. 9 shows the relationship between the edge roughness and the inverse of a gradient of the pseudo-profile of the beam, i.e., the differentiated value of the pseudo-profile of the beam, that is taken at the threshold level of the profile that is the minimum level of the dosage required for resolving the resist. As will be seen from FIG. 9, the edge roughness is in proportion to the inverse of the gradient of the pseudo-profile of the beam, i.e., the inverse of the differentiated value of the profile, which well indicates the amount of variation. For these reasons, the amount of defocus calculated based on the edge roughness provides an index which sensitively indicates the rate of variation of the gradient of the pseudo-profile of the beam and, hence, the change in a lithographic factor or factors which affect the pseudo-profile of the beam.

In accordance with another aspect of the present invention, there is provided a lithographic process which, based on the amount of defocus computed through the described method, optimizes a lithographic factor that causes the defocus of the pseudo-beam profile.

In the lithographic process of the present invention, the lithographic factor is optimized based on the amount of defocus of the pseudo profile of the beam which sensitively reflects a change in the lithographic factor, thus ensuring better optimization of the lithographic factor.

These and other objects, features and advantages of the present invention will become clear from the following description when the same is read in conjunction with the accompanying drawings.

DESCRIPTION OF THE PREFERRED EMBODIMENTS

Embodiments of the method for computing a defocus amount, as well as a lithographic process, in accordance with the present invention will be described with reference to the accompanying drawings. Although the description proceeds in the context of a lithographic process that employs a direct-writing-type exposure device using an electron beam, it is to be understood that the invention also can be applied to lithographic processes employing other types of exposure techniques. The lithographic process embodying the present invention will be described with reference to FIG. 1, which is a flowchart showing the process.

Figure 1:
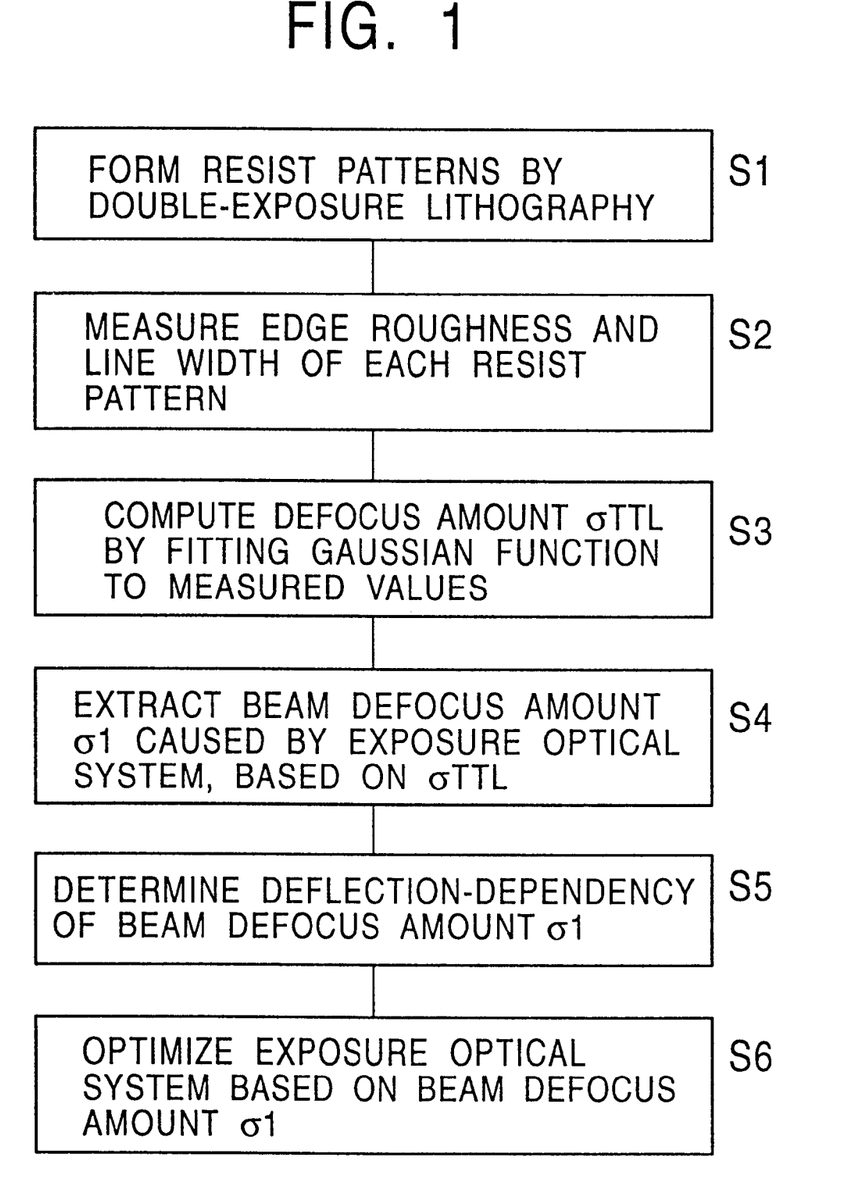
FIG. 1 is a flowchart showing an embodiment of the present invention.

In Step S1, resist patterns are formed on a wafer by a double exposure of a resist on the wafer and a subsequent development.

To explain in more detail, an 8-inch silicon wafer coated with a chemically-amplified resist NEB22 (commercial name) produced by Sumitomo Chemical Co., Ltd. is applied to a thickness of 250 nm by spin coating technique.

Then, a double exposure is performed on the resist that coats the wafer by using a direct-writing exposure device HL800D manufactured by Hitachi Limited. More specifically, an isolated line having a design line width of 100 nm is written by exposure at a dosage of 8.0 $\mu C/cm^2$. Then, an area of 65 $\mu m$ by 65 $\mu m$, centered at the isolated line, is subjected to a full-area exposure.

The double exposure is executed a plurality of times while varying the dosage as a parameter factor. For instance, numerous dosage levels are employed between 0.8 $\mu C/cm^2$ and 3.4 $\mu C/cm^2$. The double-exposure operations are performed such that the deflection amplitudes or widths are the same, e.g., the deflection widths in the X- and Y-directions are zero, over all the plural double-exposure operations.

Figure 2A:
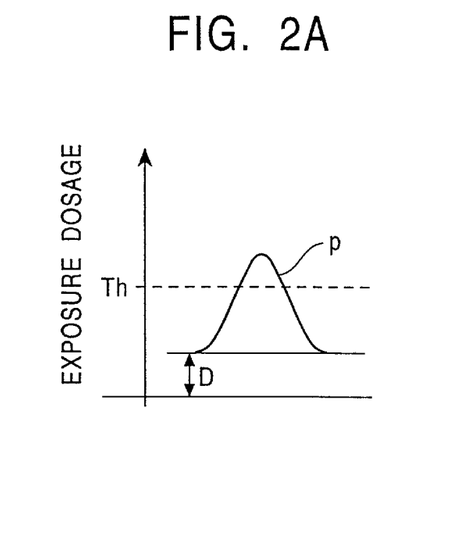
FIGS. 2A and 2B are illustrations explanatory of a double exposure and a pseudo-profile of the beam used in the embodiment.
Figure 2B:
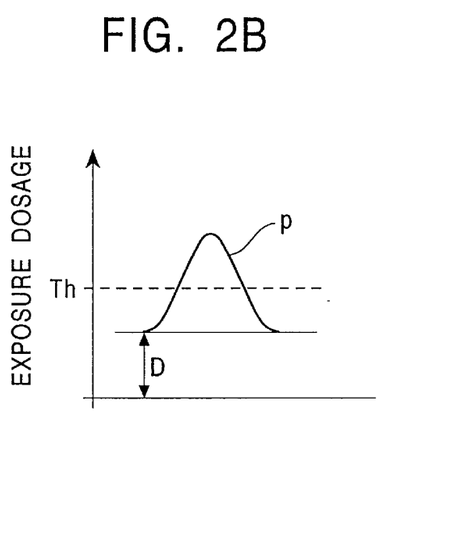

Thus, double-exposure operations are performed a plurality of times, while varying the dosage D in the full-area exposure. This produces an effect equivalent to that obtained when a threshold value Tha changed while the intensity distribution of the exposure beam for writing the isolated line, i.e., the beam profile "p", remains unchanged, as will be seen from FIGS. 2A and 2B. It is to be understood that the term "beam profile" means a so-called pseudo-profile "p" of the beam which contains variations caused by lithographic factors that include all the factors affecting the accuracy of the lithography. Such lithographic factors are, for example, the characteristics of the lens system of the exposure device, the kinds of resist employed, the conditions of the resist process, the developing conditions, the degree of degradation of the mask, and so forth.

The design line width and the dosage may be set to any desired values. The size of the area to be exposed should be large enough to cover the radius of backward scattering of the exposure beam. For instance, when the acceleration voltage of the electron beam used as the exposure beam is 50 keV, the area preferably has a size of 10 $\mu m$ by 10 $\mu m$. The sequence of the two steps of the double exposure, i.e., the exposure for writing the isolated line and the full-area exposure, the kind of the resist material, the resist thickness and other conditions of forming the resist pattern may be freely determined as long as these conditions are consistent over all the double-exposure operations.

In step 2 measurement of the edge roughness and the line width of each of the resist patterns that were formed through the plurality of double-exposure operations and subsequent developing operations is performed.

Figure 3:
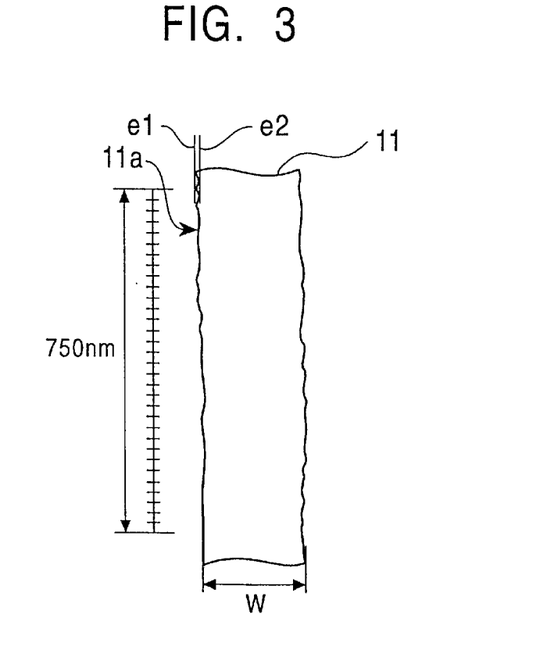
FIG. 3 is an illustration of an edge roughness of a resist pattern.

The term "edge roughness" is used to mean the amplitude over which the edge position fluctuates, as indicated by edge positions e1 and e2 shown in FIG. 3. By way of example, a region of 750 nm long of an edge portion 11a of the resist pattern 11 is divided into 32 sections, and dispersion 3σ of the mean edge positions of these sections from the least square line is calculated and used as the edge roughness 3σ. At the same time, the width W of the resist pattern 11 is measured through an electron microscope.

Figure 4:
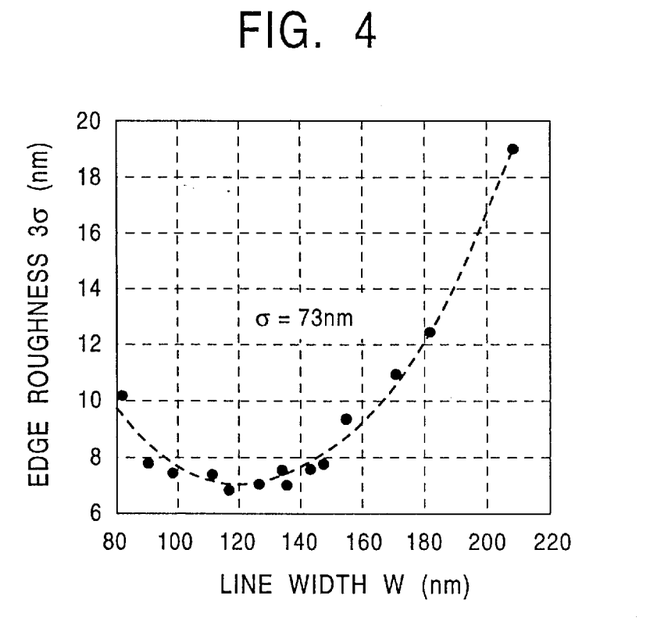
FIG. 4 is a diagram showing the relationship between the edge roughness and the line width of each resist pattern.

In Step S3, a Gaussian function represented by a broken-line curve is fitted to the relationship between the edge roughness 3σ and the line width W that were measured in Step S2, as shown in FIG. 4. More specifically, the fitting is executed by using as a parameter the distribution width, which in this case is the standard deviation σ. The standard deviation σ of the Gaussian function thus fitted is calculated (the standard deviation σ being 73 nm in this case) and used as a defocus amount σTTL of the pseudo-profile of the beam.

The defocus amount σTTL, as described, is determined based on the resist pattern that actually has been formed and, therefore, contains defocus amount components σ2, σ3 and so on that vary according to the type of the resist, the resist process, the developing conditions, the degree of degradation of the mask and so forth, in addition to the beam defocus amount σ1 that is purely attributed to the lens system of the exposure device. The defocus amount σTTL in this sense is referred to as the defocus amount of the pseudo-profile of the beam.

In Step S4, the beam defocus amount σ1 dependent on a specific lithographic factor, i.e., the lens system of the exposure device, is extracted from the defocus amount σTTL that was calculated in Step S3. More specifically, the sum of the defocus components σ2, σ3 and so on other than the beam defocus amount σ1 caused by lithographic factors other than the lens system of the exposure device is determined through experiments and simulations, and the sum thus determined is subtracted from the defocus amount σTTL, whereby the beam defocus amount σ1 alone is extracted.

Figure 5:
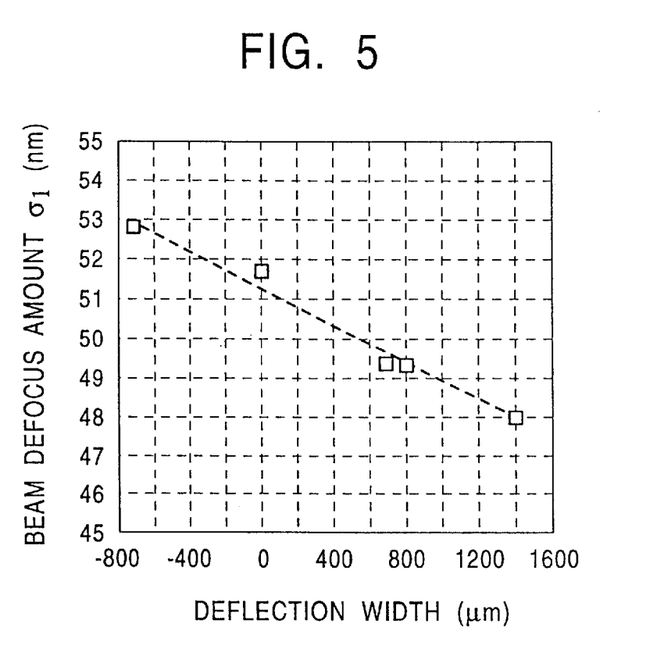
FIG. 5 is a diagram showing an example of deflection-dependency of a beam defocus amount (1.

Then, in Step S5, the deflection-dependency of the beam defocus amount σ1 is determined as shown in FIG. 5. More specifically, the operation for calculating the beam defocus amount σ1 through Steps S1 to S4 are repeated with a variety of magnitudes of deflection of the exposure beam, i.e., the electron beam, on the wafer, and the relationship between the deflection magnitude and the beam defocus amount σ1 is determined. Thus, the lithographic operation is performed a plurality of times while the magnitude of deflection of the exposure beam as a particular lithographic factor is varied, whereby the beam defocus amounts σ1 are calculated for a variety of values of the deflection magnitudes. The deflection-dependency of the beam defocus amount σ1 is then determined based on the relationship between the deflection magnitude and the defocus amount σ.

In Step S6, the lens system of the exposure device is adjusted based on the deflection-dependency of the beam defocus amount σ1 that has been determined through the preceding steps.

Figure 6:
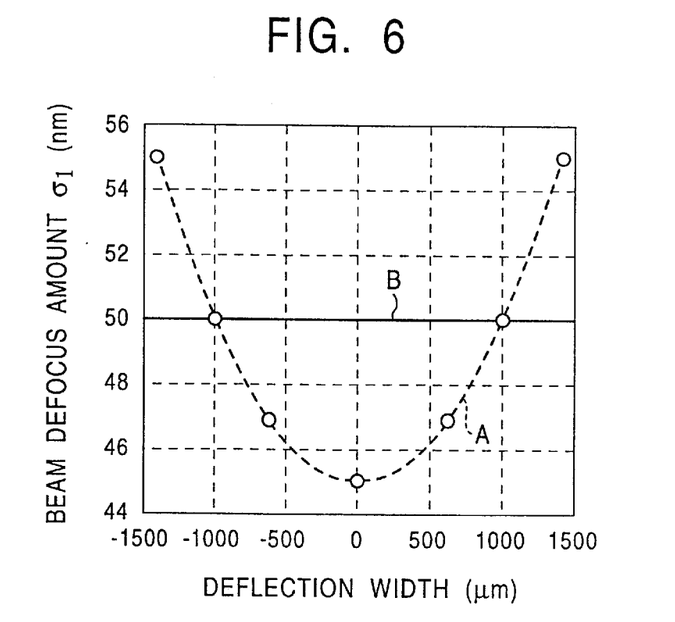
FIG. 6 is a diagram showing another example of deflection-dependency of a beam defocus amount (1.

By way of example, when the beam defocus amount σ1 exhibits such dependency on the deflection magnitude as indicated by curve A in FIG. 6, the adjustment of the lens system of the exposure device may be effected such that the beam defocus amount σ1 does not exhibit dependency any more on the deflection magnitude as indicated by curve B in FIG. 6.

Figure 7:
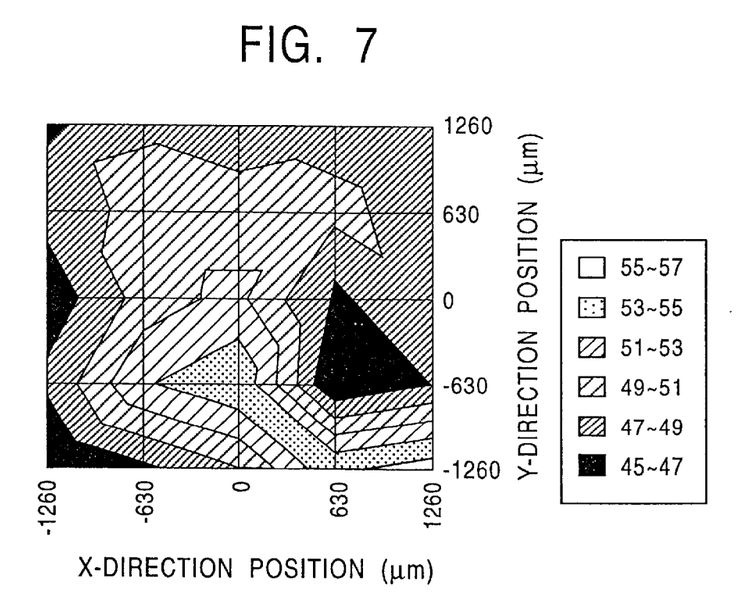
FIG. 7 is an illustration of X- and Y-deflection distributions of the beam defocus amount (1.
Figure 8A:
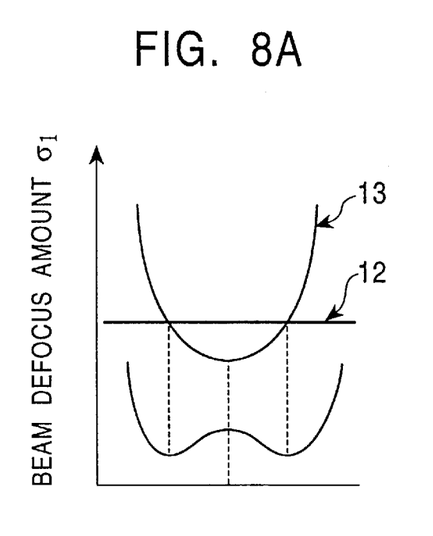
FIGS. 8A and 8B are diagrams showing the relationship between a wafer surface and a focal plane of an exposure beam in relation to a beam defocus amount (1.
Figure 8B:
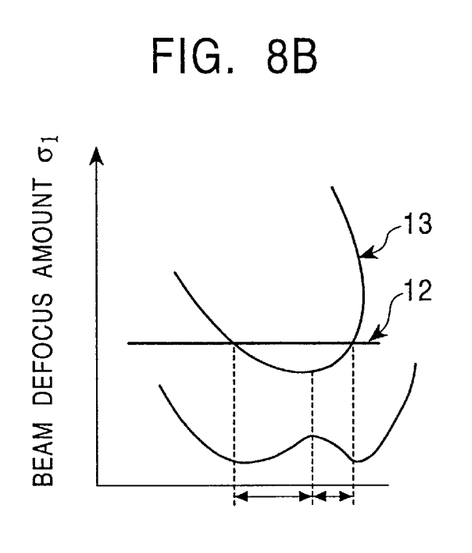

FIG. 7 shows the X- and Y-deflection distributions of the beam defocus amounts σ1 that were determined through Steps S1 to S4 at respective deflection magnitude positions that were varied within the range from (−X, −Y) to (+X, +Y). FIGS. 8A and 8B show the relationship between the wafer surface 12 and the focal plane 13 of the exposure beam, in relation to the beam defocus amount σ1.

Referring to FIG. 7 showing the X- and Y-deflection distributions of the beam defocus amount σ1, a peak of the beam defocus amount σ1 is observed at the center at which the deflection magnitudes are zero both in X- and Y-directions. This suggests that the focal plane 13 of the exposure-beam intersects the wafer surface 12, as shown in FIG. 8A. In this case, therefore, the lens system of the exposure device is adjusted so as to raise the focal position of the exposure beam, thus reducing the beam defocus amount σ1 at the center of the exposure, and thereby optimizing the lens system.

Referring again to FIG. 7 showing the X- and Y-deflection distributions of the beam defocus amounts σ1, different gradients of variation of the beam defocus amount σ1 appear in the +Y direction and the −Y direction in the region where the X-direction deflection magnitude is zero. This suggests that the optical axis of the exposure beam is inclined in the +Y direction, as shown in FIG. 8B. In this case, therefore, the lens system of the exposure device is optimized by being adjusted such that the optical axis of the exposure beam is normal to the wafer surface 12.

It is thus possible to optimize the lens system of the exposure device so that the beam defocus amount σ1 is reduced and made uniform over the area of the wafer surface. Then, an exposure is performed by using the optimized lens system of the exposure device, followed by a developing operation, whereby a resist pattern is formed on the wafer to complete the lithographic process.

The defocus amount computing method, as described, has a step of computing the defocus amount σTTL of a pseudo-profile of the beam based on the line width and the edge roughness of the resist pattern. Resist patterns were formed by writing isolated lines with design line widths of 40 nm to 120 nm. The formation of the resist pattern was conducted by a so-called mask-bias technique, while adjusting the dosage, so that each written isolated line had a line width of 100 nm. FIG. 9 shows the relationship between the edge roughness 3σ and the inverse of the gradient of the pseudo-profile of the beam taken at a threshold level that is calculated by setting the standard deviation σ to σ=73 for each of the resist patterns. From FIG. 9, it will be seen that the edge roughness 3σ is proportional to the inverse of the gradient of the pseudo-profile of the beam, i.e., to the inverse of the differentiated value which well indicates the amount of variation. From this fact, it is understood that the defocus amount σTTL calculated based on the edge roughness 3σ provides an index which sensitively represents the lithographic factors that affect the pseudo-profile of the beam.

For this reason, the beam defocus amount σ1 determined based on the defocus amount σTTL is a value which sensitively represents a variation in the lens system of the exposure device among the lithographic factors. It is, therefore, possible to accurately determine a variation in the lens system of the exposure device using the beam defocus amount σ1 determined from the defocus amount σTTL.

The aforementioned known art, which scans a metallic pattern with an exposure beam and determines the beam defocus amount based on the scanning result, has a drawback in that the beam defocus amount thus determined contains error factors attributable to the effect of the scanning and the effect of deflection of the exposure beam, as explained before. In contrast, the method of the embodiment described heretofore is free from this drawback and can determine the beam defocus amount σ1 without being affected by factors such as the effect of the scanning and the effect of deflection of the exposure beam. This also proves that the beam defocus amount σ1 determined in accordance with the described embodiment sensitively reflects a variation in the lens system of the exposure device above all other lithographic factors.

The lithographic process of the invention optimizes the particular lithographic factor, namely, the characteristics of the lens system of the exposure device in this case, based on the defocus amount σTTL determined by the described technique. It is, therefore, possible to achieve a higher degree of optimization of the lithographic factor than ever.

Defocus of an exposure beam affects the resolution limit in the lithographic process. The present invention improves the resolution limit of lithography by virtue of the optimization of the lens system of the exposure device performed based on the beam defocus amount σ1.

In the embodiment described heretofore, the beam defocus amount σ1 is extracted from the defocus amount σTTL and then the deflection-dependency of the beam defocus amount σ1 is determined. This procedure, however, is only illustrative, and the deflection-dependency of the beam defocus amount σ1 may be determined in a different way. For instance, the exposure beam, i.e., the electron beam, is caused to impinge upon the wafer with different magnitudes of deflection, and the defocus amount σTTL is calculated through Steps S1 to S3 described before for each of the deflection magnitudes, so that the deflection-dependency of the defocus amount σ1 is approximately determined based on the relationship between the deflection magnitudes and the defocus amounts σTTL.

The embodiment described heretofore is intended to adjust and optimize the lens system of an exposure device based on the beam defocus amount σ1 that is attributable to the lens system of the exposure device. This, however, is only illustrative, and the invention can equally be used for the purpose of optimizing each of the other lithographic factors that affect the accuracy of lithography by computing the amount of defocus attributable to each such lithographic factor and adjusting the lithographic factor based on the computed amount of defocus. Such lithographic factors affecting the accuracy of lithography are the kind of the resist, the resist film thickness, the developing conditions, the degree of degradation of reticle, and so on. In accordance with the present invention, it is possible to optimize each such lithographic factor based on the amount of defocus attributable thereto.

By executing a lithographic process while varying any particular one of these lithographic factors as a parameter, it is possible to compute the dependency of the defocus amount on such particular lithographic factor. For instance, when the developing condition is selected as the particular lithographic factor, steps S1 to S4 of the described method are executed a plurality of times employing different developing temperatures. In Step S4, however, a defocus amount attributable to the developing condition is calculated instead of the defocus amount attributable to the lens system. The variable parameters may be the pre-bake temperature, the post-exposure baking temperature, the resist film thickness, the forward beam scattering, the masking time, the mask thickness, and so forth. It is possible to calculate the dependency of the defocus amount in each of such parameters. Each parameter as a lithographic factor can be optimized based on the calculated dependency, thus achieving optimization of the lithography.

The embodiment has been described in the context of lithography employing an electron beam exposure device that uses an electron beam as the exposure beam. The use of an electron beam, however, is not exclusive, and the invention can be carried out with a variety of types of exposure devices which use different types of exposure beams, such as g-beam, i-beam, KrF, ArF, VUV, EUV, X-ray and charged particles.

As will be understood from the foregoing description, the method of the present invention employs a calculation of the amount of defocus of a pseudo-profile of the beam which involves defocus components attributable to all the lithographic factors, the calculation being executed based on the line width and the edge roughness of a resist pattern, the edge roughness sensitively reflecting and representing any change in a lithographic factor. It is, therefore, possible to accurately grasp any change occurring in any of the lithographic factors and, hence, to adequately optimize such a lithographic factor, thus contributing to an improvement in the accuracy of the lithography.

Although the invention has been described through its specific form, it is to be understood that the described embodiment is only illustrative and various changes and modifications may be imparted thereto without departing from the scope of the present invention which is limited solely by the appended claims.

What is claimed is:

1. A method of computing a defocus amount in lithography, comprising the steps of: measuring line width and edge roughness of a resist pattern formed by lithography;
   calculating, based on the measured line width and the measured edge roughness, the amount of defocus of a pseudo-profile of the beam used in said lithography;
   preparing a plurality of said resist patterns by executing plural double-exposure operations each including a pattern exposure for forming a pattern of a predetermined line width and a full-area exposure over an area covering said pattern, said full-area exposure being executed while employing different dosage levels for the full-area exposures in different double-exposure operations;
   conducting the measurement of the line width and the edge roughness for each of said resist patterns; and
   calculating said amount of defocus based on the line widths and edge roughnesses measured on the respective resist patterns.

2. A method of computing a defocus amount in lithography according to claim 1, wherein the step of calculating the amount of defocus includes fitting a Gaussian function to the line widths and edge roughnesses obtained with said resist patterns, and determining the distribution width of said Gaussian function as said amount of defocus.

3. A method of computing a defocus amount in lithography, comprising the steps of:
   measuring line width and edge roughness of a resist pattern formed by lithography;
   calculating, based on the measured line width and the measured edge roughness, the amount of defocus of a pseudo-profile of the beam used in said lithography;
   subtracting, from said amount of defocus of said pseudo-profile of the beam, the defocus components attributable to all other lithographic factors than a particular lithographic factor, thereby extracting the amount of defocus attributable to said particular lithographic factor.

4. A method of computing a defocus amount in lithography, comprising the steps of:
   measuring line width and edge roughness of a resist pattern formed by lithography;
   calculating, based on the measured line width and the measured edge roughness, the amount of defocus of a pseudo-profile of the beam used in said lithography;
   preparing a plurality of said resist patterns by lithography while employing, for different resist patterns, different values of a particular lithographic factor as a parameter among the lithographic factors that contribute to the defocus of said pseudo-profile of the beam;
   conducting the measurement of the line width and the edge roughness for each of said resist patterns;
   calculating the amounts of defocus based on the line widths and edge roughnesses of the respective resist patterns as obtained with said different values of said particular lithographic factor; and
   calculating the dependency of said amount of defocus on said particular lithographic factor.

5. A lithographic process, comprising the steps of:
   measuring line width and edge roughness of a resist pattern formed by lithography;
   calculating, based on the measured line width and the measured edge roughness, the amount of defocus of a pseudo-profile of the beam used in said lithography;
   optimizing a lithographic factor that has caused the defocus of said pseudo-profile of the beam, based on said amount of defocus;
   subtracting, after the step of calculating said amount of defocus of said pseudo-profile of the beam, the defocus components attributable to all other lithographic factors than a particular lithographic factor from said amount of defocus of said pseudo-profile of the beam, thereby extracting the amount of defocus attributable to said particular lithographic factor;

wherein the optimizing step optimizes said particular lithographic factor.

6. A lithographic process, comprising the steps of:

measuring line width and edge roughness of a resist pattern formed by lithography;

calculating, based on the measured line width and the measured edge roughness, the amount of defocus of a pseudo-profile of the beam used in said lithography;

optimizing a lithographic factor that has caused the defocus of said pseudo-profile of the beam, based on said amount of defocus;

preparing a plurality of said resist patterns by lithography while employing, for different resist patterns, different values of a particular lithographic factor as a parameter among the lithographic factors that contribute to the defocus of said pseudo-profile of the beam;

conducting the measurement of the line width and the edge roughness for each of said resist patterns;

calculating the amounts of defocus based on the line widths and edge roughnesses of the respective resist patterns as obtained with said different values of said particular lithographic factor;

calculating the dependency of said amount of defocus on said particular lithographic factor; and optimizing said particular lithographic factor based on the calculated dependency.

* * * * *